(12) United States Patent　　(10) Patent No.: US 9,893,199 B2
Khan et al.　　　　　　　　　　(45) Date of Patent: Feb. 13, 2018

(54) PREPARATION METHOD OF REDUCED AND N-DOPED GRAPHENE OXIDE AND THE REDUCED AND N-DOPED GRAPHENE OXIDE THEREBY

(71) Applicant: DAEGU GYEONGBUK INSTITUTE OF SCIENCE AND TECHNOLOGY, Daegu (KR)

(72) Inventors: Firoz Khan, Daegu (KR); Seong-Ho Baek, Daegu (KR); Jae Hyun Kim, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 14/966,700

(22) Filed: Dec. 11, 2015

(65) Prior Publication Data

US 2016/0315194 A1　Oct. 27, 2016

(30) Foreign Application Priority Data

Apr. 24, 2015　(KR) .................. 10-2015-0057963

(51) Int. Cl.
*H01L 29/786* (2006.01)
*H01L 29/49* (2006.01)
(Continued)

(52) U.S. Cl.
CPC ........ *H01L 29/7869* (2013.01); *C01B 32/182* (2017.08); *H01L 29/4908* (2013.01); *H01L 29/778* (2013.01); *H01L 29/1606* (2013.01)

(58) Field of Classification Search
CPC ... H01L 29/7869; H01L 29/24; H01L 29/513; H01L 29/4908; H01L 29/42356;
(Continued)

(56) References Cited

U.S. PATENT DOCUMENTS

| 2010/0301279 A1* | 12/2010 | Nesper | B82Y 30/00 252/502 |
| 2011/0079748 A1* | 4/2011 | Ruoff | B82Y 30/00 252/62.2 |
| 2015/0119581 A1* | 4/2015 | Loh | B01J 21/18 549/59 |

FOREIGN PATENT DOCUMENTS

| CN | 102431997 | * | 5/2012 |
| CN | 103101909 A | | 5/2013 |

(Continued)

*Primary Examiner* — Dale E Page
*Assistant Examiner* — Mohammed R Alam
(74) *Attorney, Agent, or Firm* — Lando & Anastasi, LLP (57) ABSTRACT

The present invention provides a preparation method of the reduced and N-doped graphene oxide comprising the steps of preparing the mixed solution containing graphene oxide (GO) and tetramethylammonium hydroxide (TMAH) (step 1) and heating the mixed solution prepared in step 1 (step 2). The preparation method of the reduced and N-doped graphene oxide of the present invention can provide the fully reduced and N-doped graphene oxide even at a low temperature by using tetramethylammonium hydroxide, the tetra ammonium salt, as a nitrogen dopant. According to this method, N-doping level can be regulated by controlling the mixing ratio of graphene oxide and tetramethylammonium hydroxide. Further, this method does not need any additional additive to prepare the reduced and N-doped graphene oxide, so that it is a pro-environmental method that facilitates the mass-production simply with solution process.

8 Claims, 9 Drawing Sheets

(51) Int. Cl.
*H01L 29/778* (2006.01)
*C01B 32/182* (2017.01)
*H01L 29/16* (2006.01)

(58) Field of Classification Search
CPC ........ B01J 35/0033; B01J 37/12; B01J 35/10; B01J 37/06; B01J 23/40; B01J 23/44; B01J 23/52; B01J 23/70; B01J 27/20; B01J 23/22; B01J 21/18; C07D 409/12; C07C 211/28; C07C 211/04; C01B 31/043
See application file for complete search history.

(56) References Cited

FOREIGN PATENT DOCUMENTS

| | | | |
|---|---|---|---|
| CN | 103145122 | * | 6/2013 |
| KR | 10-1084975 | B1 | 11/2011 |
| KR | 10-2013-0027199 | | 3/2013 |
| KR | 10-2014-0054784 | | 5/2014 |
| KR | 10-1400441 | B1 | 6/2014 |

* cited by examiner

PREPARATION METHOD OF REDUCED AND N-DOPED GRAPHENE OXIDE AND THE REDUCED AND N-DOPED GRAPHENE OXIDE THEREBY

CROSS-REFERENCE TO RELATED APPLICATION

This application claims priority under 35 U.S.C. § 119 (a)-(d) to Korean Patent Application Serial No. KR 10-2015-0057963, filed on Apr. 24, 2015, which is hereby incorporated herein by reference in its entirety for all purposes.

BACKGROUND OF THE INVENTION

1. Field of the Invention

The present invention relates to a preparation method of reduced and N-doped graphene oxide and the reduced and N-doped graphene oxide prepared thereby, more precisely the method for preparing the reduced and N-doped graphene oxide using low temperature process.

2. Description of the Related Art

Graphene is as thick as one carbon atom and has a 2-dimensional tabular structure. Graphene is composed of $sp^2$ carbon hybrid structure, so that it has excellent electrical, thermal, and mechanical properties. Also, graphene has a large surface area of 300~400 $m^2/g$, so that it can favorably applied to various fields such as transistor, transparent electrode, sensor, polymer, supercapacitor, secondary cell, and energy storage materials such as hydrogen storage material, etc.

Graphene is generally prepared by chemical exfoliation chemical exfoliation. This method has the advantage of usability for the mass-production of graphene and of low production costs since the method uses graphite as a raw material. The chemical exfoliation can provide graphene in the form of colloid so regular in liquid phase as to be applied in various forms. In addition, graphene can obtain other properties by the chemical modification.

However, the $sp^2$ carbon hybrid structure of graphene prepared by such chemical exfoliation, which is graphene oxide, is easily destructed in the course of oxidation and sonication, resulting in the compromised physical properties. Thus, in that case, it is necessary to recover the $sp^2$ carbon hybrid structure through chemical reduction.

When the graphene oxide prepared by chemical exfoliation is reduced chemically, the functional groups including oxygen linked to graphene oxide are eliminated and thereafter the $sp^2$ carbon hybrid structure is recovered, resulting in the reduced graphene oxide having the original graphene-like structure.

Studies have been undergoing not only with graphene but also with graphene oxide (GO) and the reduced graphene oxide (RGO) as alternatives for graphene.

The reducing agent to reduce graphene oxide is represented by hydrazine ($NH_2NH_2$), which was once described in Korean Patent No. 10-1084975. Particularly, in this patent document, the method for reducing graphene oxide by heating, the method for reducing graphene oxide by supplying hydrogen additionally, and the method for reducing graphene oxide by treating the reducing agent prepared by mixing hydrazine and ammonia are described. However, the said patent depended on the general graphene oxide reduction method generally used so far and therefore the produced graphene film contained many functional groups including oxygen, which limits the method in reducing graphene oxide efficiently. Besides, the above method required a high temperature reaction.

Graphene composed of carbon only has high conductivity because of the n-n conjugation structure. However, when some of carbons in the graphene are substituted with nitrogen that has one more electrons than carbon, the conductivity of graphene increases.

Therefore, various methods have been proposed to synthesize N-doped graphene. Among them, chemical vapor deposition and N-plasma based method are the most representative ones.

However, these methods have a difficulty in mass-production, which have been studied in many aspects so far.

Korean Patent No. 10-1400441 presents an example of the method for preparing N-doped graphene and the N-doped graphene prepared thereby. Particularly, the patent provides the method for preparing N-doped graphene composed of the steps of mixing hexamethylene tetramine in graphene oxide dispersion; and inducing hydrothermal reaction of the graphene oxide mixed with the said amine derivative. That is, N-doped graphene has been prepared by hydrothermal reaction performed with the amine compound at the temperature of at least 100° C. So, it is obvious that this method requires a high temperature reaction for N-doping.

The present inventors studied to establish a method for preparing reduced and at the same time N-doped graphene oxide at a low temperature. In the course of the study, the inventors developed a preparation method of the reduced and N-doped graphene oxide comprising the steps of preparing the mixed solution containing graphene oxide (GO) and tetramethylammonium hydroxide (TMAH), and heating the mixed solution. The present inventors completed this invention by confirming that the reduced and N-doped graphene oxide could be satisfactorily prepared even at a low temperature by the said method.

SUMMARY OF THE INVENTION

It is an object of the present invention to provide a preparation method of the reduced and N-doped graphene oxide satisfactorily enough even at a low temperature.

To achieve the above object, the present invention provides a preparation method of the reduced and N-doped graphene oxide comprising the following steps:

preparing the mixed solution containing graphene oxide (GO) and tetramethylammonium hydroxide (TMAH) (step 1); and heating the mixed solution prepared in step 1 (step 2).

The present invention also provides the reduced and N-doped graphene oxide wherein the carbon/oxygen (C/O) atomic ratio is characteristically 2.3~8.5 and the carbon/nitrogen (C/N) atomic ratio is characteristically 10~20.

Further, the present invention provides the reduced and N-doped graphene prepared by the method of claim 1 in the structure composed of a gate electrode; a gate insulator on top of the gate electrode; a semiconductor oxide on top of the gate insulator; and the reduced and N-doped graphene oxide on top of the semiconductor oxide; and the transistor which is located on top of the reduced and N-doped graphene oxide and contains a source electrode and a drain electrode facing each other.

Advantageous Effect

The preparation method of the reduced and N-doped graphene oxide of the present invention can provide the fully reduced and N-doped graphene oxide even at a low temperature by using tetramethylammonium hydroxide, the tetra ammonium salt, as a nitrogen dopant. According to this method, N-doping level can be regulated by controlling the mixing ratio of graphene oxide and tetramethylammonium hydroxide. Further, this method does not need any additional additive to prepare the reduced and N-doped graphene oxide, so that it is a pro-environmental method that facilitates the mass-production simply with solution process.

BRIEF DESCRIPTION OF THE DRAWINGS

The application of the preferred embodiments of the present invention is best understood with reference to the accompanying drawings, wherein.

DESCRIPTION OF THE PREFERRED EMBODIMENTS

The present invention provides a preparation method of the reduced and N-doped graphene oxide comprising the following steps:

preparing the mixed solution containing graphene oxide (GO) and tetramethylammonium hydroxide (TMAH) (step 1); and heating the mixed solution prepared in step 1 (step 2).

Hereinafter, the preparation method of the reduced and N-doped graphene oxide of the present invention is described in more detail step by step.

First, in the preparation method of the reduced and N-doped graphene oxide of the invention, step 1 is to prepare the mixed solution containing graphene oxide (GO) and tetramethylammonium hydroxide (TMAH).

In the prior art, the reduced graphene oxide has been prepared by using hydrazine as a reducing agent. However, hydrazine is a highly toxic and explosive material. And the reduced graphene oxide prepared by the conventional method has impurities in its structure, which results in the decrease of physical properties. Besides, it is very difficult to regulate the level of oxygen according to the conventional method.

In the prior art, the N-doped graphene oxide has been prepared by using ammonia as a nitrogen dopant. However, it is very difficult to regulate the level of N-doping and the N-doped graphene oxide might have other impurities therein.

The mentioned conventional methods require a high temperature reaction for the reduction and N-doping, which is another disadvantage of the conventional method.

So, in step 1 of the preparation method of the present invention, the mixed solution containing tetramethylammonium hydroxide and graphene oxide is prepared by using tetramethylammonium hydroxide as a nitrogen dopant. In this invention, reduction and N-doping can be achieved at a low temperature simultaneously by using tetramethylammonium hydroxide as a nitrogen dopant, and the regulation of the reduction and N-doping level can be controlled, suggesting that the reduced and N-doped graphene oxide can be efficiently prepared by the method of the present invention. This method does not require any other materials, which makes the method of the present invention pro-environmental.

Particularly, the weight ratio of tetramethylammonium hydroxide/graphene oxide in the mixed solution of step 1 is preferably 0.00001~0.5, and more preferably 0.0001~0.1, and most preferably 0.00025~0.025. If the weight ratio of tetramethylammonium hydroxide/graphene oxide in the mixed solution of step 1 is less than 0.00001, N-doping on graphene oxide is difficult. If the weight ratio is more than 0.5, the physical properties of graphene oxide itself would be reduced.

The mixed solution of step 1 can additionally include such a solvent as water, ethanol, dimethylformamide (DMF), dimethylsulfoxide (DMSO), tetrahydrofuran (THF), and acetone. In a preferred embodiment of the present invention, the mixed solution of step 1 can be an aqueous solution, but not always limited thereto.

Also, it is preferred for the mixed solution of step 1 not to include any additive such as a dispersing agent. It is the advantage of this method of the invention that fully reduced and N-doped graphene oxide can be produced without an additional additive, which makes the method pro-environmental.

Next, in the preparation method of the reduced and N-doped graphene oxide of the invention, step 2 is to heat the mixed solution prepared in step 1.

In step 2, the mixed solution containing graphene oxide and tetramethylammonium hydroxide prepared in step 1 is heated to reduce and induce N-doping of graphene oxide.

At this time, the heating temperature in step 2 is preferably 0~100° C., more preferably 20~95° C., and most preferably 25~75° C. considering energy efficiency. If the heating temperature in step 2 is lower than 0° C., the reaction between graphene oxide and tetramethylammonium hydroxide does not occur or graphene oxide is not reduced. On the other hand, if the heating temperature is higher than 100° C., the level of N-doping cannot reach the wanted level or is inefficient.

The heating in step 2 might continue at least 1 hour, preferably 1~12 hours, and most preferably 1~6 hours.

In addition, the heating in step 2 is performed with stirring at 100~1,000 rpm, and more preferably 250~600 rpm. To obtain fully reduced and N-doped graphene oxide, it is necessary to induce the reaction with full stirring as well.

Therefore, the preparation method of the reduced and N-doped graphene oxide of the present invention provides the fully reduced and N-doped graphene oxide even at a low temperature by using tetramethylammonium hydroxide, the tetra ammonium salt, as a nitrogen dopant.

Particularly, the C/O atomic ratio of the reduced and N-doped graphene oxide is preferably 2.3~8.5, and more preferably 3.0~8.0 in this invention, and also the C/N atomic ratio therein can be 10~20 and more preferably 12~16.

According to this method, N-doping level can be regulated by controlling the mixing ratio of graphene oxide and tetramethylammonium hydroxide. Further, this method does not need any additional additive to prepare the reduced and N-doped graphene oxide, so that it is a pro-environmental method that facilitates the mass-production simply with solution process.

The present invention also provides the reduced and N-doped graphene oxide wherein the carbon/oxygen (C/O) atomic ratio is characteristically 2.3~8.5 and the carbon/nitrogen (C/N) atomic ratio is characteristically 10~20.

The reduced and N-doped graphene oxide of the present invention is prepared at a low temperature by using tetramethylammonium hydroxide, the tetra ammonium salt, as a nitrogen dopant. The carbon/oxygen (C/O) atomic ratio in the reduced and N-doped graphene oxide is preferably 2.3~8.5 and more preferably 3.0~8.0, and at the same time the carbon/nitrogen (C/N) atomic ratio therein is preferably 10~20 and more preferably 12~16.

The reduced and N-doped graphene oxide of the present invention has been prepared with the regulation of the reduction and N-doping levels, so that it can be applied to a transistor with improved performance.

Further, the present invention provides the reduced and N-doped graphene prepared by the method of claim 1 in the structure composed of a gate electrode; a gate insulator on top of the gate electrode; a semiconductor oxide on top of the gate insulator; and the reduced and N-doped graphene oxide on top of the semiconductor oxide; and the transistor which is located on top of the reduced and N-doped graphene oxide and contains a source electrode and a drain electrode facing each other.

The transistor provided by the present invention contains the reduced and N-doped graphene oxide prepared by the preparation method of the invention, so that it displays excellent properties.

In particular, the levels of reduction and N-doping can be regulated for the reduced and N-doped graphene oxide, according to the present invention, so that the transistor having the desired properties can be produced by using the said graphene oxide of the invention.

Figure 1:
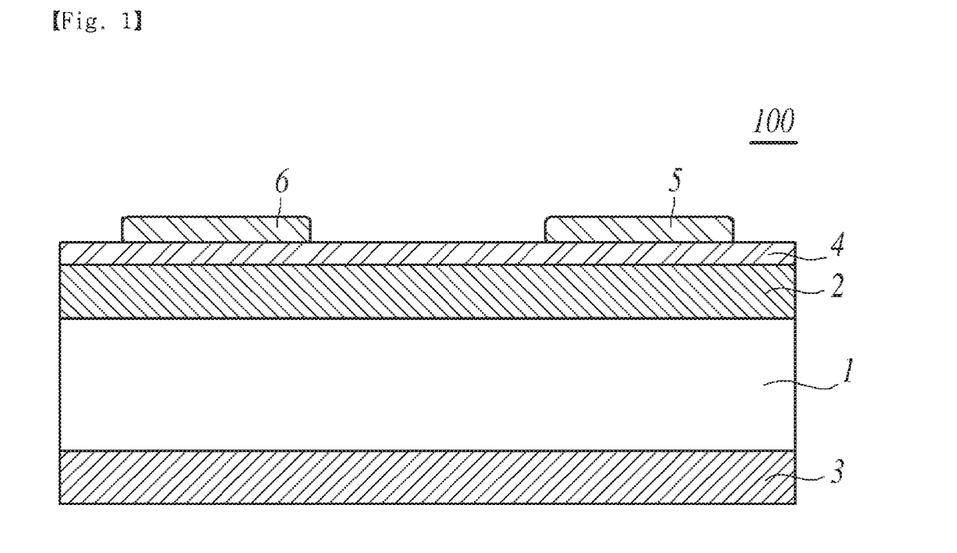
FIG. 1 is a schematic diagram illustrating an example of the transistor containing the reduced and N-doped graphene oxide prepared by the method of the present invention.

Particularly, as shown in the schematic diagram of FIG. 1, the transistor (100) of the invention can be placed on top of the reduced and N-doped graphene oxide prepared by the method of claim 1 (4) loaded on top of the semiconductor oxide (2) placed on top of the gate insulator (1) on top of the gate electrode (3); and contain the source electrode and the drain electrode facing each other (5, 6).

At this time, the gate electrode (3) can be located on top of the board and the board can be silicon (Si) wafer, glass board, or plastic board, which can be selected considering the final transistor product. For example, silicon (Si) wafer is preferred when the thin film transistor is applied to a memory device. If the board is made of glass, it is better to be applied to a display device, and if the board is made of plastic, it can be applied to an electronic device which needs to have flexibility.

The said gate insulator (1) can be n-type silicon (Si) with high doping level. The semiconductor oxide (2) herein can be a silicon oxide whose thickness is preferably 100~500 nm, but not always limited thereto. The source electrode and the drain electrode (5, 6) can be gold electrodes.

Practical and presently preferred embodiments of the present invention are illustrative as shown in the following Examples.

However, it will be appreciated that those skilled in the art, on consideration of this disclosure, may make modifications and improvements within the spirit and scope of the present invention.

Example 1: Preparation of Reduced and N-Doped Graphene Oxide 1

Step 1: 100 mL of graphene oxide (GO) aqueous solution (0.2 mg/mL) was prepared. 0.10 mL of tetramethylammonium hydroxide (TMAH) aqueous solution (0.05 mg/mL) was also prepared.

The mixed solution (TMAH(0.05 mg/mL)/GO(0.02 mg/mL=0.001(v/v)) was prepared by adding the tetramethylammonium hydroxide (TMAH) aqueous solution to the graphene oxide (GO) aqueous solution.

Step 2: The mixed solution prepared in step 1 was placed on hot plate, which was heated at 25° C. with stirring at 450 rpm for 4 hours, resulting in the preparation of the reduced and N-doped graphene oxide.

Example 2: Preparation of Reduced and N-Doped Graphene Oxide 2

The reduced and N-doped graphene oxide was prepared by the same manner as described in Example 1 except that the mixed solution was heated at 40° C. in step 2 of Example 1.

Example 3: Preparation of Reduced and N-Doped Graphene Oxide 3

The reduced and N-doped graphene oxide was prepared by the same manner as described in Example 1 except that the mixed solution was heated at 60° C. in step 2 of Example 1.

Example 4: Preparation of Reduced and N-Doped Graphene Oxide 4

The reduced and N-doped graphene oxide was prepared by the same manner as described in Example 1 except that the mixed solution was heated at 75° C. in step 2 of Example 1.

Example 5: Preparation of Reduced and N-Doped Graphene Oxide 5

The reduced and N-doped graphene oxide was prepared by the same manner as described in Example 1 except that the mixed solution was heated at 90° C. in step 2 of Example 1.

Example 6: Preparation of Reduced and N-Doped Graphene Oxide 6

The reduced and N-doped graphene oxide was prepared by the same manner as described in Example 1 except that the mixed solution (TMAH(0.05 mg/mL)/GO(0.02 mg/mL=0.0005(v/v)) was prepared with 0.05 mL of tetramethylammonium hydroxide (TMAH) aqueous solution (0.05 mg/mL) in step 1 of Example 1.

Example 7: Preparation of Field Effect Transistor 1

Step 1: A gate electrode was formed by depositing aluminum in the thickness of 100 nm on the back of n-type silicon as shown in FIG. 1.

Step 2: A silicon oxide ($SiO_2$) layer was formed in the thickness of 300 nm on top of the n-type silicon layer prepared in step 1 by using PECVD (Plasma Enhanced Chemical Vapor Deposition).

Step 3: A reduced and N-doped graphene oxide layer was formed on top of the silicon oxide layer formed in step 2 by spreading the reduced and N-doped graphene oxide prepared in Example 5.

Step 4: A field effect transistor was prepared by depositing the gold electrode as the source and drain electrode via E-beam evaporation by using a metal mask on top of the graphene oxide layer formed in step 3, which was heated at 250° C. in argon atmosphere for 30 minutes.

Example 8: Preparation of Field Effect Transistor 2

A field effect transistor was prepared by the same manner as described in Example 7 except that the reduced and N-doped graphene oxide prepared in Example 6 was spread on top of the silicon oxide layer in step 3 of Example 7.

Comparative Example 1

Step 1: 100 mL of graphene oxide (GO) aqueous solution (0.2 mg/mL) was prepared. 0.10 mL of ammonia borane ($BH_3NH_3$) aqueous solution (0.05 mg/mL) was also prepared.

The mixed solution ($BH_3NH_3$(0.05 mg/mL)/GO(0.02 mg/mL)=0.001(v/v)) was prepared by adding the ammonia borane ($BH_3NH_3$) aqueous solution to the graphene oxide (GO) aqueous solution.

Step 2: The mixed solution prepared in step 1 was placed on hot plate, which was heated at 90° C. with stirring at 450 rpm for 4 hours, resulting in the preparation of the reduced and N-doped graphene oxide.

Comparative Example 2

Step 1: 100 mL of graphene oxide (GO) aqueous solution (0.2 mg/mL) was prepared. 0.10 mL of ammonia ($NH_4OH$) aqueous solution (0.05 mg/mL) was also prepared.

The mixed solution ($NH_4OH$(0.05 mg/mL)/GO(0.02 mg/mL)=0.001(v/v)) was prepared by adding the ammonia aqueous solution to the graphene oxide aqueous solution.

Step 2: The mixed solution prepared in step 1 was placed on hot plate, which was heated at 90° C. with stirring at 450 rpm for 4 hours, resulting in the preparation of the reduced and N-doped graphene oxide.

Comparative Example 3

100 mL of graphene oxide (GO) aqueous solution was prepared, to which hydrazine ($N_2H_4$) was added. The mixture was refluxed at 90° C. for 24 hours and as a result, the reduced and N-doped graphene oxide was prepared.

Experimental Example 1

(1) C/O Atomic Ratio and C/N Atomic Ratio according to Reaction Temperature

To investigate the C/O atomic ratio and the C/N atomic ratio of the reduced and N-doped graphene oxide of the present invention according to the reaction temperature, the reduced and N-doped graphene oxides prepared in Examples 1~5 and Comparative Examples 1~3 and the conventional graphene oxide were analyzed by using Raman spectroscopy and X-ray photoelectron spectroscopy. The results are shown in FIG. 2 and Table 1.

Figure 2:
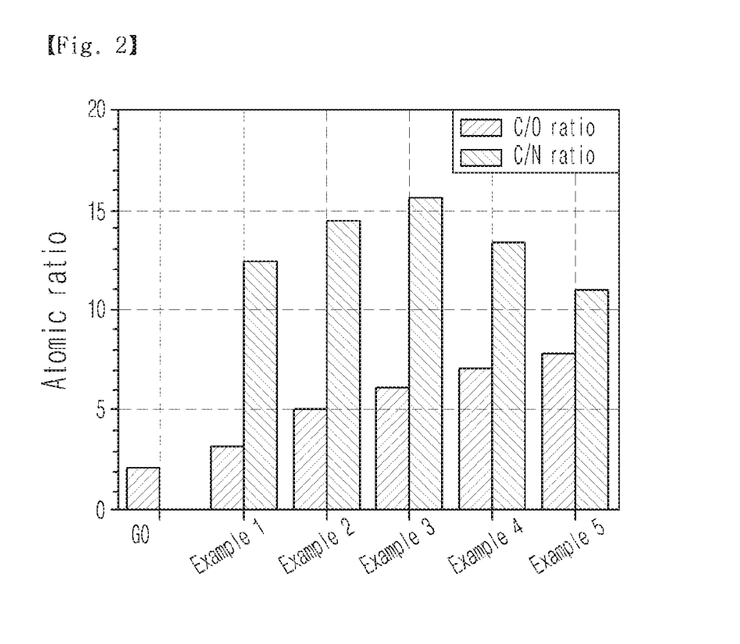
FIG. 2 is a graph illustrating the C/O atomic ratio and the C/N atomic ratio according to the reaction temperature of the reduced and N-doped graphene oxides of prepared in Examples 1~5 and Comparative Examples 1~5 and the conventional graphene oxide.

As shown in FIG. 2, the C/O atomic ratio of the graphene oxide was 2.0.

The C/O atomic ratio of the reduced and N-doped graphene oxides prepared in Examples 1~5 according to the preparation method of the invention was approximately 3.0~8.0.

The C/N atomic ratio was confirmed to be in the range between minimum 10.96 and maximum 15.6. In particular, the C/O atomic ratio of the reduced and N-doped graphene oxide prepared by the reaction at 60° C. was 5.0 or up, and the C/N atomic ratio therein was 15.6, the maximum value.

Therefore, the preparation method of the invention can induce full reduction even at a low temperature and is suitable for the regulation of N-doping level.

TABLE 1

| | Material (or method) | C/O ratio | C/N ratio |
|---|---|---|---|
| Example 5 | tetramethylammonium hydroxide | 7.86 | 10.96 |
| Comparative Example 1 | ammonia borane | 7.50 | 114.10 |
| Comparative Example 2 | ammonia | 7.21 | 125.53 |
| Comparative Example 3 | hydrazine and reflux | 11.35 | 17.15 |

As shown in Table 1, the C/O atomic ratio of the reduced and N-doped graphene oxide prepared by using tetramethylammonium hydroxide in Example 5 was 7.86 and the C/N ratio therein was 10.96, suggesting that the reduction and N-doping were successfully induced simultaneously and at this time the full reduction and the satisfactory N-doping level could be expected.

In the meantime, when the conventional materials were used, reduction was induced but was not full reaction and N-doping could be not simultaneously achieved.

Therefore, the preparation method of the invention can induce the reduction and N-doping simultaneously by using tetramethylammonium hydroxide.

(2) Graphitic C Atomic Percentage and Oxidized C Atomic Percentage according to Reaction Temperature To investigate the carbon distribution in the reduced and N-doped graphene oxide according to the reaction temperature, the reduced and N-doped graphene oxides prepared in Examples 1~5 and the conventional graphene oxide were analyzed by Raman spectroscopy and X-ray photoelectron spectroscopy. The results are shown in FIG. 3.

Figure 3:
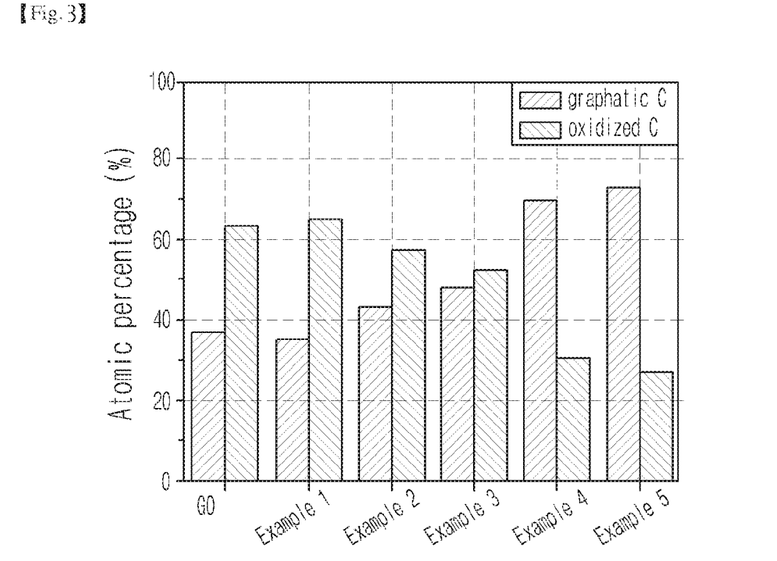
FIG. 3 is a graph illustrating the atomic percentage of graphitic C and oxidized C in the reduced and N-doped graphene oxides prepared in Example 1~5.

As shown in FIG. 3, as the reaction temperature increased, the graphitic C atomic percentage increased but oxidized C atomic percentage decreased.

Experimental Example 2

(1) X-Ray Diffractometry (XRD)

Figure 4:
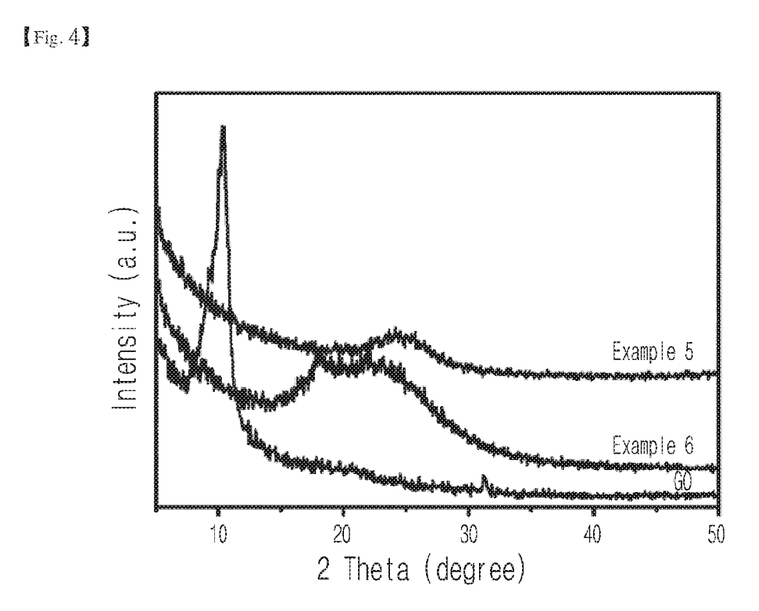
FIG. 4 is a graph illustrating the result of X-ray diffraction analysis performed to analyze the reduced and N-doped graphene oxides prepared in Examples 5 and 6 and the conventional graphene oxide.

To investigate the crystal structure of the reduced and N-doped graphene oxide prepared by the method of the present invention, the reduced and N-doped graphene oxides prepared in Examples 5 and 6 and the conventional graphene oxide were analyzed by X-ray diffractometry, and the results are shown in FIG. 4.

As shown in FIG. 4, it was confirmed that the 2θ values of the graphene oxides of the invention were higher than the 2θ value of the conventional graphene oxide.

Particularly, the 2θ value of the conventional graphene oxide was 10.33°, while the 2θ value of the graphene oxide having the TMAH/GO weight ratio of 0.000125, prepared in Example 6, was 21.9°. In the meantime, the 2θ value of the graphene oxide having the TMAH/GO weight ratio of 0.00025, prepared in Example 5, was 24.32°.

(2) Raman Spectroscopy

Figure 5:
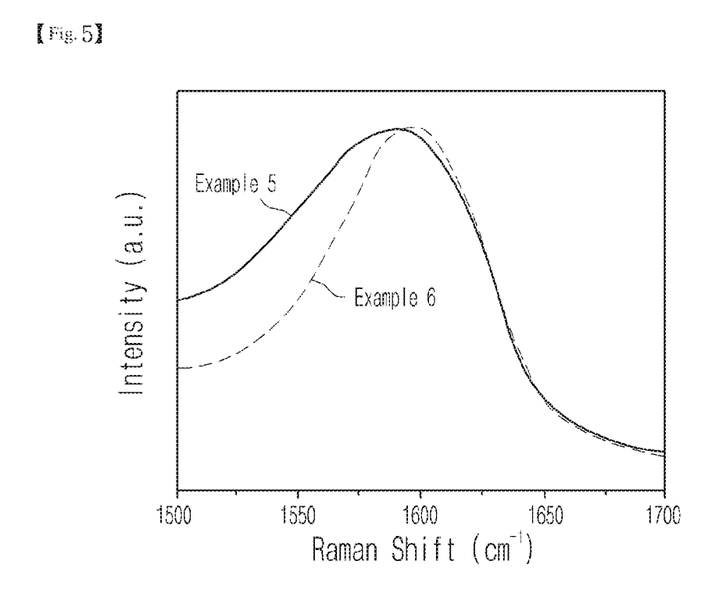
FIG. 5 is a graph illustrating the result of Raman spectroscopy performed to analyze the reduced and N-doped graphene oxides prepared in Examples 5 and 6.

To investigate the optical characteristics of the reduced and N-doped graphene oxide prepared by the method of the present invention, the reduced and N-doped graphene oxides prepared in Examples 5 and 6 were analyzed by Raman spectroscopy, and the results are shown in FIG. 5.

As shown in FIG. 5, it was confirmed that the Raman wavelength of the graphene oxide having the TMAH/GO weight ratio of 0.00025, prepared in Example 5, was moved left, compared with the graphene oxide having the TMAH/GO weight ratio of 0.000125, prepared in Example 6.

(3) X-Ray Photoelectron Spectroscopy (XPS)

Figure 6:
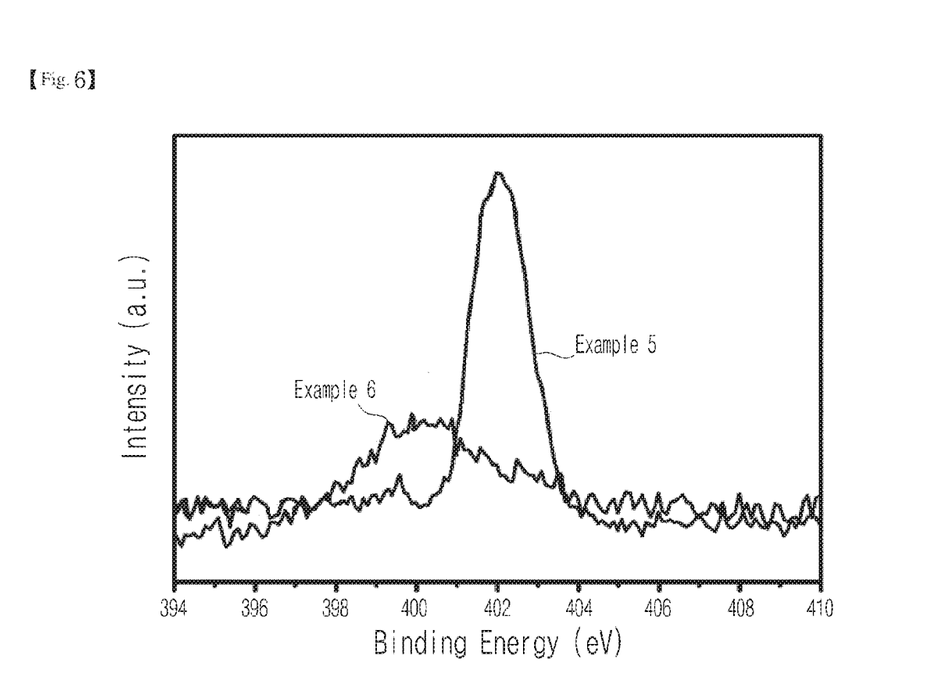
FIG. 6 is a graph illustrating the result of X-ray photoelectron spectroscopy performed to analyze the reduced and N-doped graphene oxides prepared in Examples 5 and 6.

To investigate the composition of the reduced and N-doped graphene oxide prepared by the method of the present invention, the reduced and N-doped graphene oxides prepared in Examples 5 and 6 were analyzed by X-ray photoelectron spectroscopy, and the results are shown in FIG. 6.

As shown in FIG. 6, the graphene oxide prepared in Example 6 having the TMAH/GO weight ratio of 0.000125 produced a very weak peak at 400 eV (bond energy), indicating that it would be pyridinic N.

In the meantime, the graphene oxide prepared in Example 5 having the TMAH/GO weight ratio of 0.00025 produced a sharp peak at 402 eV (bond energy), indicating that it would be graphitic N.

(4) $I_D/I_G$ Ratio

Figure 7:
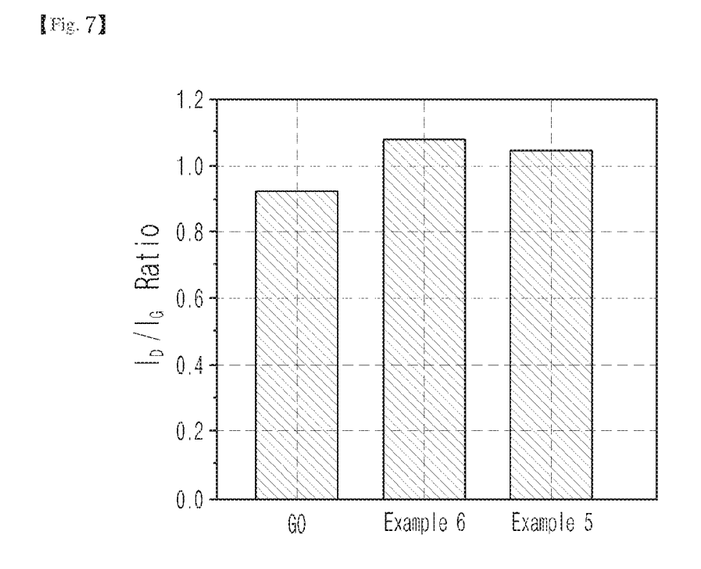
FIG. 7 is a graph illustrating the $I_D/I_G$ ratio of the reduced and N-doped graphene oxides prepared in Examples 5 and 6 and the conventional graphene oxide.

The strength ratios of D peak and G peak of the reduced and N-doped graphene oxides prepared in Examples 5 and 6 were investigated, and the results are shown in FIG. 7.

As shown in FIG. 7, the $I_D/I_G$ ratio of the reduced and N-doped graphene oxide was higher than that of the conventional graphene oxide.

Experimental Example 3

Figure 8:
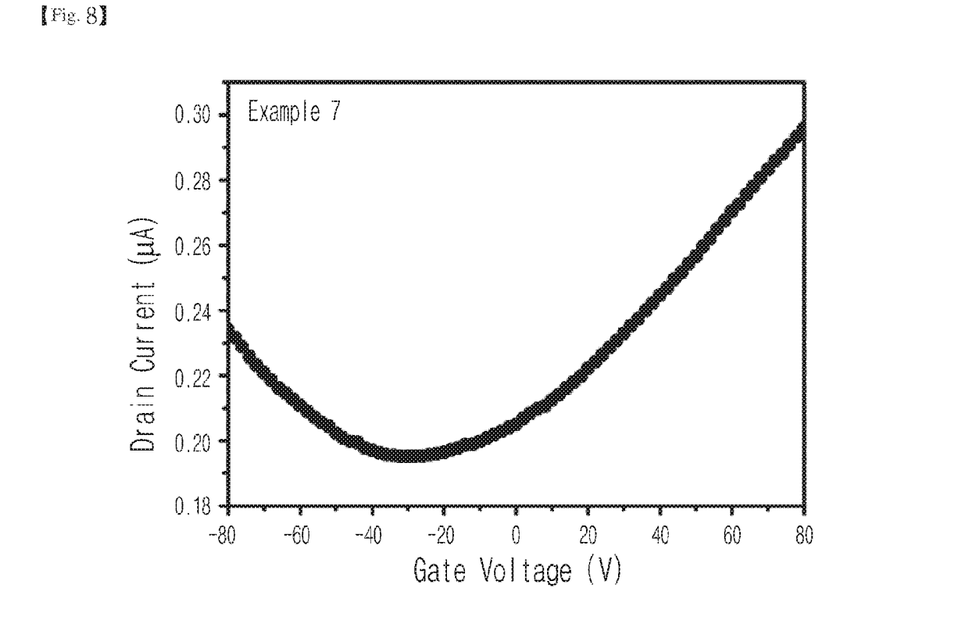
FIG. 8 and FIG. 9 are graphs illustrating the performance of the field effect transistors prepared in Examples 7 and 8.
Figure 9:
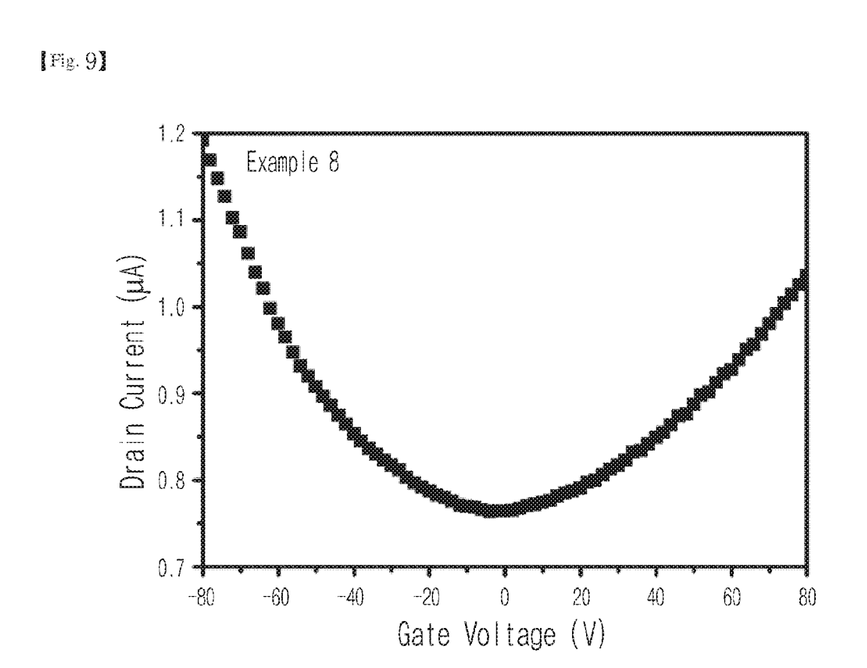

To investigate the performance of the field effect transistor where the reduced and N-doped graphene oxide prepared by the method of the present invention had been applied, the field effect transistor prepared in Example 7 was analyzed by using a semiconductor analyzer (keithley 4200-SCS), and the results are shown in FIGS. 8 and 9.

As shown in FIG. 8, the field effect transistor comprising the graphene oxide of Example 5 having the TMAH/GO weight ratio of 0.00025 displayed the gate voltage of −1 V.

As shown in FIG. 9, the field effect transistor comprising the graphene oxide of Example 6 having the TMAH/GO weight ratio of 0.000125 displayed the gate voltage of −31 V.

Therefore, it was confirmed that the work function could be changed by the TMAH/GO weight ratio. And the field effect transistor comprising the graphene oxide having the TMAH/GO weight ratio of 0.000125 displayed n-type semiconductor like characteristics, which was confirmed by the change of gate voltage.

BRIEF DESCRIPTION OF THE MARK OF DRAWINGS

100: transistor
1: gate insulator
2: semiconductor oxide
3: gate electrode
4: reduced and N-doped graphene oxide
5: source electrode
6: drain electrode

What is claimed is:

1. A method of preparing reduced and N-doped graphene oxide, comprising:
   preparing a mixed solution containing graphene oxide (GO) and tetramethylammonium hydroxide (TMAH);
   wherein the weight ratio of tetramethylammonium hydroxide/graphene oxide in the mixed solution is 0.00001~0.5; and
   heating the mixed solution at a temperature of 60~75° C., thereby producing the reduced and N-doped graphene oxide.

2. The preparation method of claim 1, wherein the mixed solution can additionally include one or more solvents selected from the group consisting of: water, ethanol, dimethylformamide (DMF), dimethylsulfoxide (DMSO), tetrahydrofuran (THF), and acetone.

3. The preparation method of claim 1, wherein the mixed solution does not include a dispersing agent.

4. The preparation method of claim 1, wherein heating is performed for 1~6 hours.

5. The preparation method of claim 1, wherein heating is performed with stirring at a stirring speed of 100~1000 rpm.

6. A reduced and N-doped graphene oxide prepared by the method of claim 1, having a carbon/oxygen atomic ratio of 2.3~8.5 and a carbon/nitrogen atomic ratio of 10~20.

7. The reduced and N-doped graphene oxide according to claim 6, wherein the carbon/oxygen atomic ratio is 3.0~8.0 and the carbon/nitrogen atomic ratio is 12~16.

8. The preparation method of claim 1, thereby producing a reduced and N-doped graphene oxide having a carbon/oxygen atomic ratio of 2.3~8.5 and a carbon/nitrogen atomic ratio of 10~20.

* * * * *